(12) United States Patent
Hong et al.

(10) Patent No.: US 8,779,439 B2
(45) Date of Patent: Jul. 15, 2014

(54) SILICON CARBIDE SCHOTTKY-BARRIER DIODE DEVICE AND METHOD FOR MANUFACTURING THE SAME

(75) Inventors: Kyoung Kook Hong, Gyeonggi-do (KR); Jong Seok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/371,702

(22) Filed: Feb. 13, 2012

(65) Prior Publication Data

US 2013/0112991 A1    May 9, 2013

(30) Foreign Application Priority Data

Nov. 7, 2011  (KR) .................. 10-2011-0114972

(51) Int. Cl.
*H01L 29/872* (2006.01)
(52) U.S. Cl.
USPC ............. 257/77; 257/136; 257/328; 257/135; 257/331; 257/341; 438/572
(58) Field of Classification Search
USPC .................... 257/77, 136, 328, 135, 331, 341
See application file for complete search history.

(56) References Cited

U.S. PATENT DOCUMENTS

| | | | | |
|---|---|---|---|---|
| 5,449,925 A * | 9/1995 | Baliga et al. | | 257/77 |
| 5,635,412 A * | 6/1997 | Baliga et al. | | 438/520 |
| 7,199,442 B2 | 4/2007 | Shenoy | | |
| 7,411,218 B2 * | 8/2008 | Seng et al. | | 257/77 |
| 7,728,402 B2 * | 6/2010 | Zhang et al. | | 257/471 |
| 7,851,274 B1 * | 12/2010 | Shah | | 438/139 |
| 8,330,244 B2 * | 12/2012 | Zhang et al. | | 257/471 |
| 8,368,165 B2 * | 2/2013 | Richieri | | 257/473 |
| 2003/0096464 A1 | 5/2003 | Lanois | | |
| 2005/0269573 A1 * | 12/2005 | Seng et al. | | 257/77 |
| 2006/0267090 A1 * | 11/2006 | Sapp et al. | | 257/341 |
| 2007/0090481 A1 * | 4/2007 | Richieri | | 257/473 |
| 2009/0096053 A1 * | 4/2009 | Tsuchida et al. | | 257/486 |
| 2009/0243026 A1 * | 10/2009 | Nakamura et al. | | 257/471 |
| 2009/0278169 A1 * | 11/2009 | Hayashi et al. | | 257/183 |
| 2009/0315036 A1 * | 12/2009 | Zhang et al. | | 257/76 |
| 2011/0248285 A1 * | 10/2011 | Zhang et al. | | 257/77 |
| 2011/0250736 A1 * | 10/2011 | Ohta et al. | | 438/478 |
| 2011/0256699 A1 * | 10/2011 | Masuda | | 438/571 |
| 2012/0119225 A1 * | 5/2012 | Shiomi et al. | | 257/77 |
| 2012/0146055 A1 * | 6/2012 | Mitani et al. | | 257/77 |

FOREIGN PATENT DOCUMENTS

| | | | |
|---|---|---|---|
| JP | 08064848 | A | 3/1996 |
| JP | 11097717 | A | 4/1999 |
| JP | 11214711 | A | 8/1999 |
| JP | 11233796 | A | 8/1999 |
| JP | 2004266115 | A | 9/2004 |
| JP | 2004-327530 | A | 11/2004 |
| JP | 2010050315 | A | 3/2010 |

* cited by examiner

*Primary Examiner* — Julio J Maldonado
*Assistant Examiner* — Jaehwan Oh
(74) *Attorney, Agent, or Firm* — Edwards Wildman Palmer LLP; Peter F. Corless

(57) ABSTRACT

The present invention provides a silicon carbide Schottky-barrier diode device and a method for manufacturing the same. The silicon carbide Schottky bather diode device includes a primary n– epitaxial layer, an n+ epitaxial region, and a Schottky metal layer. The primary n– epitaxial layer is deposited on an n+ substrate joined with an ohmic metal layer at an undersurface thereof. The n+ epitaxial region is formed by implanting n+ ions into a central region of the primary n– epitaxial layer. The Schottky metal layer is deposited on the n+ epitaxial layer.

11 Claims, 10 Drawing Sheets

SILICON CARBIDE SCHOTTKY-BARRIER DIODE DEVICE AND METHOD FOR MANUFACTURING THE SAME

CROSS-REFERENCE TO RELATED APPLICATION

This application claims priority under 35 U.S.C. §119(a) to Korean Patent Application No. 10-2011-0114972, filed Nov. 7, 2011, the entire contents of which are incorporated herein by reference.

BACKGROUND (a) Technical Field

The present invention relates to a silicon carbide Schottky-barrier diode device and a method for manufacturing the same. More particularly, it relates to a silicon carbide Schottky-barrier diode device, which reduces on-resistance through ion-implantation into a conduction region, and a method for manufacturing the same.

(b) Background Art

Recently, there has been a trend toward the development of application devices with a larger size and capacity, which has created a growing demand for semiconductor power devices having high breakdown voltage, high current, and high-speed switching characteristics.

Silicon carbide (SiC) power devices have better characteristics than silicon (Si) based power devices with respect to high breakdown voltage, high current, and high-speed switching characteristics.

In the case of a conventional art SiC Schottky barrier diode (SBD), a lightly-doped epitaxial layer with increased thickness is generally applied to improve the breakdown voltage of a device. However, this method is disadvantageous because when there is a thick, lightly-doped epitaxial layer in a conduction region, the resistance of the conduction region increases upon application of a forward voltage, thereby reducing the on-resistance characteristics of the device. As a result of the above limitation, the development of a SiC Schottky barrier diode (SBD) generally requires the application of a termination structure that displays improved withstanding voltage characteristics when used with an epitaxial layer of minimal thickness.

Accordingly, in a Schottky barrier diode, the on-resistance characteristics depend on the doping concentration and distance between a cathode electrode and a Schottky contact in which a current flows. Similarly, the breakdown voltage characteristics depend on the doping concentration and the distance between the cathode electrode and the Schottky contact. However, due to the electric field crowding effect, the on-resistance and breakdown voltage characteristics are primarily determined by the structure of the edge termination of a Schottky junction.

In view of the foregoing, there is a need in the art for SiC Schottky barrier diodes that do not suffer from the above disadvantages associated with conventional art SiC diodes.

SUMMARY OF THE DISCLOSURE

The present invention provides a silicon carbide (SiC) Schottky barrier diode device, and a method for manufacturing the same, in which on-resistance is reduced by allowing a current to flow into a highly-doped conduction region upon application of a forward voltage. Additionally, the breakdown voltage is not reduced upon application of a backward voltage. According to an aspect of the invention, the conduction regions is formed by implanting n+ ions into an n− epitaxial layer of a device to overcome weakening of current characteristics due to increase of the on-resistance upon application of the forward voltage of the device, which typically occur when a lightly-doped conduction region is thickly formed to improve the withstanding voltage characteristics.

In one aspect, the present invention provides a SiC Schottky barrier diode device including: a primary n− epitaxial layer deposited on an n+ substrate joined with an ohmic metal layer at an undersurface thereof; an n+ epitaxial region formed by implanting n+ ions into a central region of the primary n− epitaxial layer; and a Schottky metal layer deposited on the n+ epitaxial region.

In an exemplary embodiment, the SiC Schottky barrier diode device may further include a secondary n− epitaxial layer deposited on the primary n− epitaxial layer and the n+ epitaxial region.

In another aspect, the present invention provides a method for manufacturing a silicon carbide Schottky barrier diode device, including: depositing a primary n− epitaxial layer on an n+ substrate of a wafer state; forming an n+ epitaxial region by implanting n+ ions into a central region of the primary n− epitaxial layer; and depositing an ohmic metal layer on an undersurface of the n+ substrate and depositing a Schottky metal layer directly on the n+ epitaxial layer.

In an exemplary embodiment, the method may further include forming a secondary n− epitaxial layer on the primary n− epitaxial layer and the n+ epitaxial layer under the Schottky metal layer.

In another exemplary embodiment, the method may further include additionally depositing the n− epitaxial layer and then more thickly forming the n+ epitaxial layer in a central region thereof by ion implantation.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings, which are given hereinbelow by way of illustration only, and thus are not limitative of the present invention, and wherein.

Figure 1:
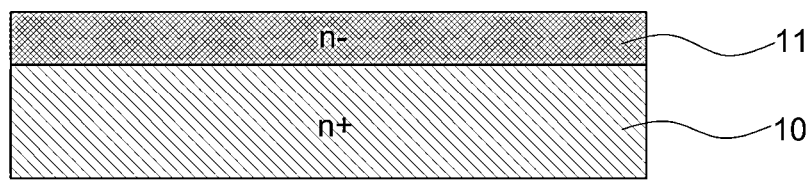
FIGS. 1 through 4 are cross-sectional views illustrating a process for manufacturing a silicon carbide Schottky barrier diode device according to an embodiment of the present invention.

Reference numerals set forth in the Drawings includes reference to the following elements as further discussed below:

10: n+ substrate
11: primary n− epitaxial layer
12: secondary n− epitaxial layer
13: n+ epitaxial layer
14: Schottky metal layer
15: ohmic metal layer

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Unless specifically stated or obvious from context, as used herein, the term "about" understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

To facilitate a more complete understanding of the present invention, a process of manufacturing a silicon carbide (SiC) Schottky barrier diode device according to an embodiment of the present invention will be described in detail with reference to FIGS. 1 through 4.

As shown in FIG. 1, a primary n− epitaxial layer 11 may be deposited on an n+ substrate 10 that is, for example, a wafer. In this case, the doping concentration of the n+ substrate 10 may be about $10^{18}/cm^3$, and the doping concentration of the primary n− epitaxial layer 11 may range from about $10^{15}/cm^3$ to about $10^{16}/cm^3$. The first n− epitaxial layer 11 may have a thickness of about 2 μm or more, such that n+ ions can be implanted into the first n− epitaxial layer 11.

Figure 2:
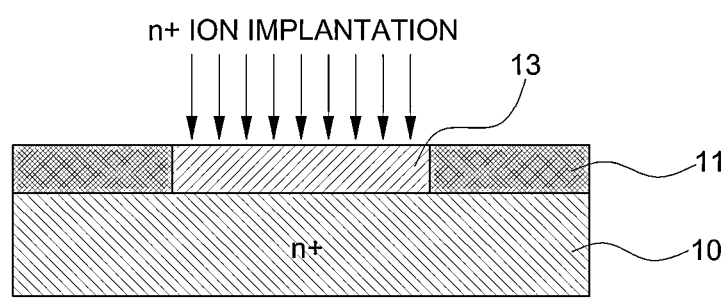
Figure 3:
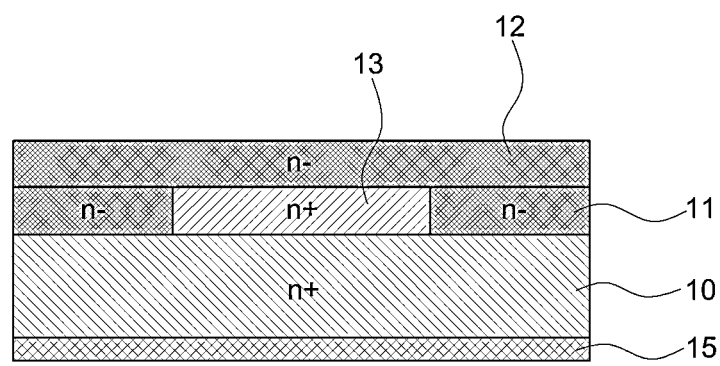

As shown in FIG. 2, an n+ epitaxial region 13 may be formed by implanting n+ ions into the central region of the primary n− epitaxial layer 11. For example, a mask may be applied to other regions of the primary n− epitaxial layer 11 except the central region thereof, and then n+ ions may be implanted into the central region of the primary n− epitaxial layer 11 to form the n+ epitaxial region 13 in the central region of the primary n− epitaxial layer 11.

In order to stabilize a damaged wafer surface after the ion implantation, heat-treatment may be performed at a high temperature of about 1,400° C. to about 1,600° C. or in an atmosphere of, e.g., hydrogen gas. Also, in order to improve the withstanding voltage characteristics, after the n− epitaxial layer 11 is additionally deposited, the n+ epitaxial region 13 may be more thickly formed on the central region thereof through ion implantation.

Figure 6A:
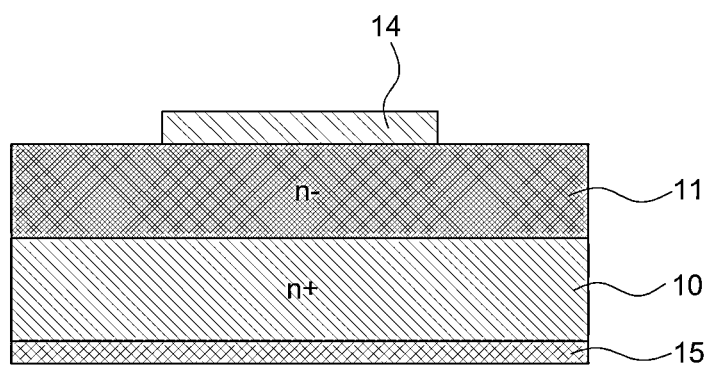
FIG. 6A shows the structure of a typical diode of the conventional art.
Figure 6B:
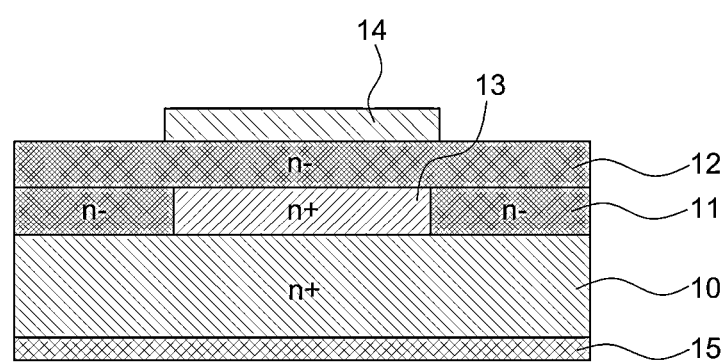
FIGS. 6B and 6C show cross-sectional views illustrating a structure of a silicon carbide Schottky barrier diode device for a test example of the present invention.
Figure 6C:
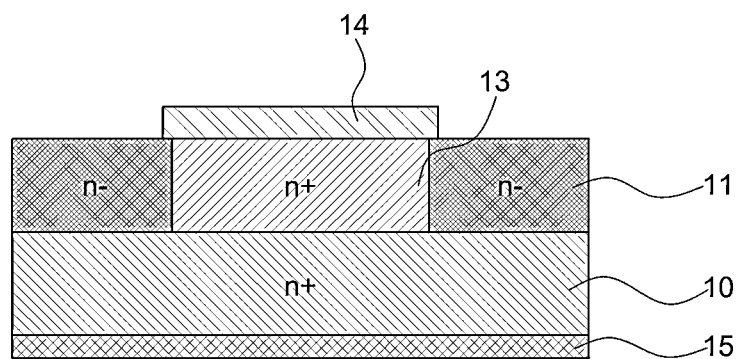
Figure 7:
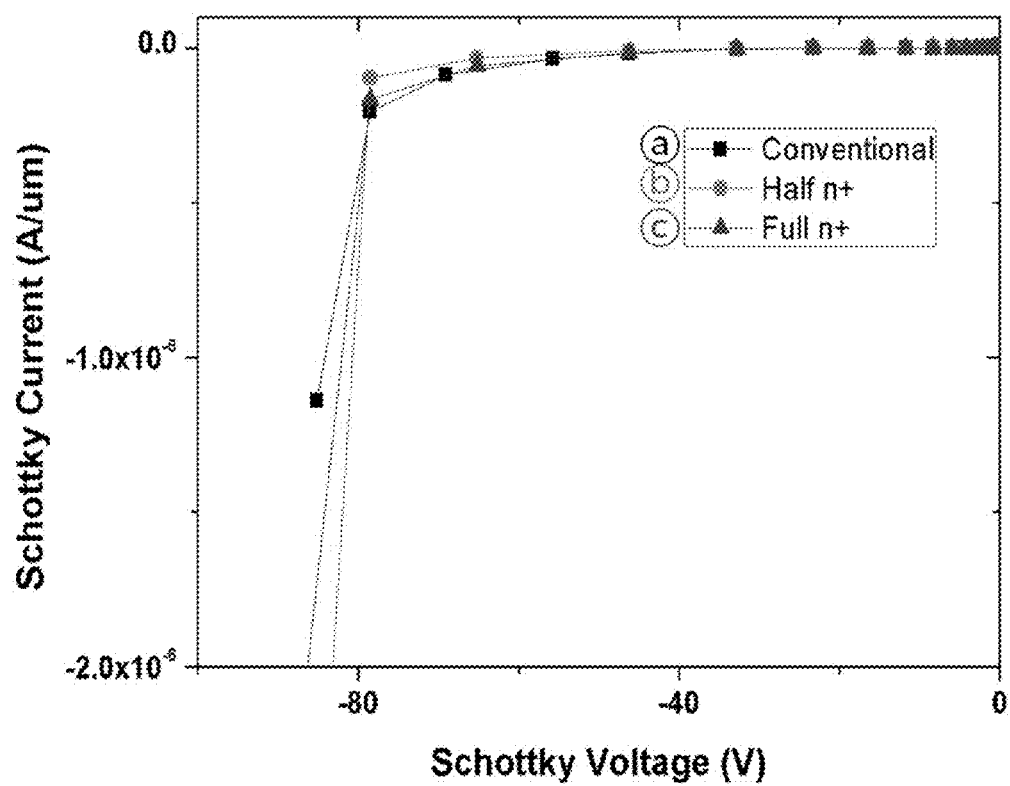
FIGS. 7 and 8 are graphs illustrating results of a test example of the present invention.

FIG. 7 illustrates an example in which a secondary n− epitaxial layer 12 is additionally deposited on the primary n− epitaxial layer 11 and the n+ epitaxial region 13 to improve the withstanding voltage characteristics. The doping concentration of the secondary n− epitaxial layer 12 may be similar to that of the primary n− epitaxial layer. In this case, when the n+ epitaxial region 13 is also formed in the central region of the additionally-deposited secondary n− epitaxial layer 12, as shown in FIG. 6C, the n+ epitaxial region 13 may become a highly-doped conduction region that is adjacent to a Schottky metal layer 14. For example, the doping concentration of the n+ epitaxial region 13 may range from about $10^{17}/cm^3$ to about $10^{19}/cm^3$. According to the invention, the doping concentration, or level, of the n+ epitaxial region 13 is preferably higher than the doping concentration, or level, of the adjoining n− epitaxial regions 11 and 12.

An ohmic metal layer may also be deposited under the wafer, i.e., the n+ substrate 10, and the Schottky metal layer 14 may be deposited on the secondary n− epitaxial layer 12 to form a SiC Schottky bather diode device according to an embodiment of the present invention.

The Schottky metal layer 14 may be formed of metal such as, for example, Ti, Ni, Mo, and/or W, and an additional termination structure may be applied to the Schottky metal layer 14 to improve the withstanding voltage characteristics. The ohmic metal layer 15 may be formed of metal such as, for example, Ni, Ti, TiC, and/or TaC. Heat-treatment may be performed on each of the metal layers 14 and 15 to achieve the desired characteristics thereof.

As shown in FIG. 6C, the Schottky metal layer 14 may be directly deposited on the n+ epitaxial region 13 without formation of the secondary n− epitaxial layer. In this case, separate heat-treatment conditions and junction metal may be applied to secure the Schottky junction characteristics. It may be necessary to optimize the termination structure in order to secure the desired breakdown conditions, and one of skill in the art will recognize that this optimization will vary depending upon the exact composition and structure of the SiC Schottky diode.

Figure 4:
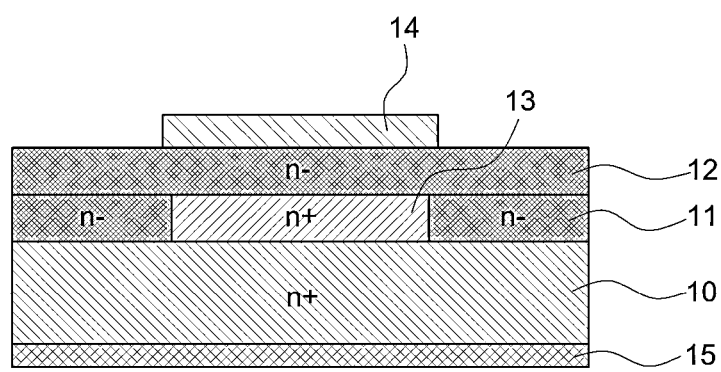

The structure of a silicon carbide Schottky barrier diode device that is manufactured by the above process will be described with reference to FIG. 4. The silicon carbide Schottky barrier diode device may include a primary n− epitaxial layer 11 deposited on an n+ substrate 10, an n+ epitaxial region 13 that is formed in an exemplary embodiment by implanting n+ ions into the central region of the primary n− epitaxial layer 11, and a Schottky metal layer 14 deposited over the n+ epitaxial region 13. A secondary n− epitaxial layer 12 may be further deposited on the primary n− epitaxial layer 11 and the n+ epitaxial region 13, and under the Schottky metal layer 14.

Figure 5:
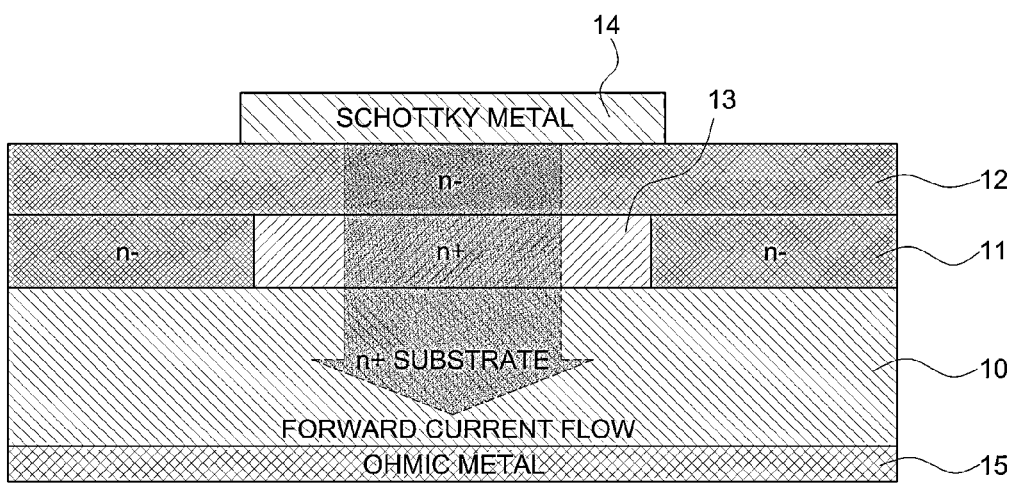
FIG. 5 is a cross-sectional view illustrating a silicon carbide Schottky barrier diode device and a current flow state according to an embodiment of the present invention.

Accordingly, when a forward voltage is applied as shown in FIG. 5, a current sequentially flows from the Schottky metal layer 14, through the second n− epitaxial layer 12, through the n+ epitaxial region 13, and toward the n+ substrate 10. The on-resistance and breakdown voltage will vary according to the doping concentrations of the primary and secondary n– epitaxial layers 11 and 12, the ion implantation of the n+ epitaxial region 13, and the thickness of each epitaxial layer, thereby providing multiple approaches for optimization. For example, ion implantation may be used to reduce forward on-resistance without reducing the breakdown voltage, and the area of a device can be reduced in proportion to the improvement of current density, thereby achieving a substantial savings in cost.

Test Examples

Figure 8:
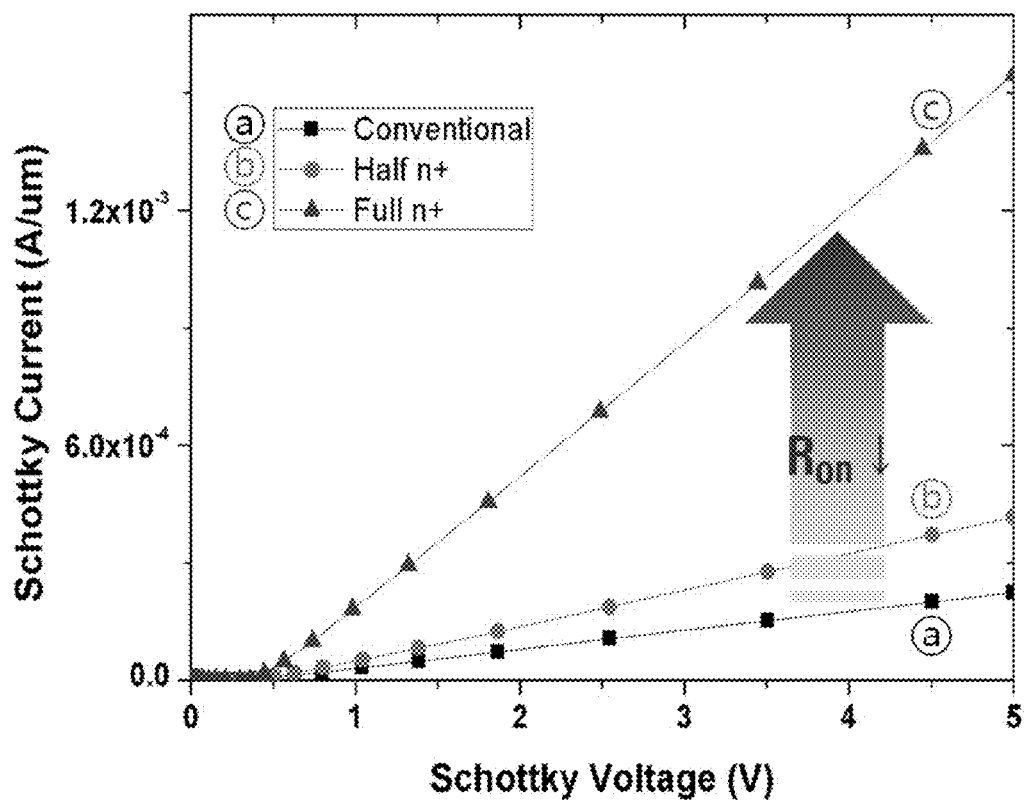

A silicon carbide (SiC) Schottky bather diode device according to an embodiment of the present invention was simulated using TCAD to verify a reduction in the on-resistance relative to a conventional art diode, and the test results are shown in FIGS. 7 and 8.

In this case, the test was performed using: 1) a conventional art structure lacking an n+ epitaxial layer into which ions are implanted, in which a conduction region is lightly doped (see, e.g., FIG. 6A); 2) a structure in which an n+ epitaxial region 13—i.e. a highly-doped conduction region—is partially formed (see FIG. 6B), and 3) a structure in which a Schottky metal layer 14 is directly deposited on an n+ epitaxial region 13 that is more thickly formed (see FIG. 6C).

According to the breakdown voltage simulation, as shown in FIG. 7, it is possible to obtain similar breakdown characteristics between the three different structures. Without being bound by theory, it is believed that the primary breakdown mechanism results from electric field crowding on the edge of the Schottky junction, i.e. the Schottky edge termination. However, the I-V characteristics showed that the on-resistance was reduced according by increasing the n+ region as shown in FIG. 8. The on-resistance was lowest when the highly-doped conduction region was extended to the Schottky contact (see, e.g., FIG. 6C). Without being bound by theory, it could be understood that upon application of a forward voltage, the resistance was significantly reduced because the n+ highly-doped region, i.e., the n+ epitaxial region 13 existed in the current-flowing conduction region.

Based on the above results, while the on-resistance was reduced and the characteristics were improved upon forward voltage application by forming the n+ region only in the conduction region, it can be verified that breakdown characteristics similar to those of the related art can be secured because the n– region exists in the Schottky edge termination. Additionally, if a high-voltage termination structure such as an electric field plate structure or electric field limiting frame structure for improvement of the withstanding voltage characteristics is used, the high-voltage termination structure can achieve an increased effect of the breakdown voltage in all cases.

According to an embodiment of the present invention, it is possible to provide a power device in which the on-resistance is reduced by allowing a current to flow into a highly-doped conduction region (n+ epitaxial layer) upon application of a forward voltage, and the breakdown voltage is not reduced upon application of a backward voltage, by implanting n+ ions into a conduction epitaxial layer of the power device to overcome weakening of current characteristics due to increase of the on-resistance upon application of the forward voltage.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A silicon carbide Schottky barrier diode device comprising:
    an n+ substrate;
    a first n– epitaxial layer deposited on the n+ substrate, wherein the first n– epitaxial layer contains a first n+ epitaxial region and a first n– epitaxial region; and
    a Schottky metal layer deposited on the first n+ epitaxial region such that the first n+ epitaxial region is sandwiched between the Schottky metal layer and the n+ substrate,
    wherein the Schottky metal layer covers an entire upper surface of the first n+ epitaxial region.

2. The silicon carbide Schottky barrier diode device of claim 1, further comprising an ohmic metal layer joined to the n+ substrate such that the n+ substrate is sandwiched between the ohmic metal layer and the first n– epitaxial layer.

3. The silicon carbide Schottky barrier diode device of claim 1, wherein the first n+ epitaxial region is formed by implanting n+ ions into the first n– epitaxial layer.

4. The silicon carbide Schottky barrier diode device of claim 3, wherein the first n+ epitaxial region is substantially centrally located within the first n– epitaxial layer.

5. The silicon carbide Schottky barrier diode device of claim 3, wherein the first n+ epitaxial region has a first doping concentration and the first n– epitaxial layer has a second doping concentration, the first doping concentration is greater than the second doping concentration.

6. The silicon carbide Schottky barrier diode device of claim 5, wherein the first doping concentration ranges from about $10^{17}/cm^3$ to about $10^{19}/cm^3$, and the second doping concentration ranges from about $10^{15}/cm^3$ to about $10^{16}/cm^3$.

7. The silicon carbide Schottky barrier diode device of claim 1, wherein the first n– epitaxial layer is at least 2 μm in thickness.

8. The silicon carbide Schottky barrier diode device of claim 1, wherein the doping concentration of the first n– epitaxial layer is about $10^{15}/cm^3$ to about $10^{16}/cm^3$.

9. The silicon carbide Schottky barrier diode device of claim 1, wherein the doping concentration of the first n+ epitaxial layer is about $10^{17}/cm^3$ to about $10^{19}/cm^3$.

10. The silicon carbide Schottky barrier diode device of claim 1, wherein the doping concentration of the first n+ substrate is about $10^{18}/cm^3$.

11. The silicon carbide Schottky barrier diode device of claim 1,
    wherein the first n– epitaxial region is disposed under an edge termination of the Schottky metal layer.

* * * * *